(12) United States Patent
Blume et al.

(10) Patent No.: US 9,072,043 B2
(45) Date of Patent: Jun. 30, 2015

(54) OPTIMIZING POWER CONSUMPTION OF A BASE STATION

(75) Inventors: Oliver Blume, Stuttgart (DE); Dietrich Zeller, Sindelfingen (DE); Anton Ambrosy, Tiefenbronn (DE)

(73) Assignee: Alcatel Lucent, Boulogne-Billancourt (FR)

( * ) Notice: Subject to any disclaimer, the term of this patent is extended or adjusted under 35 U.S.C. 154(b) by 65 days.

(21) Appl. No.: 13/878,340

(22) PCT Filed: Aug. 22, 2011

(86) PCT No.: PCT/EP2011/064355
§ 371 (c)(1),
(2), (4) Date: Apr. 8, 2013

(87) PCT Pub. No.: WO2012/045517
PCT Pub. Date: Apr. 12, 2012

(65) Prior Publication Data
US 2013/0203434 A1   Aug. 8, 2013

(30) Foreign Application Priority Data

Oct. 8, 2010   (EP) ..................................... 10290540

(51) Int. Cl.
*H04W 52/02*    (2009.01)
*H03F 1/02*     (2006.01)
(Continued)

(52) U.S. Cl.
CPC ......... *H04W 52/0206* (2013.01); *H03F 1/0261* (2013.01); *H03F 3/24* (2013.01);
(Continued)

(58) Field of Classification Search
CPC ... H03F 1/0261; H03F 2200/451; H03F 3/24; H03G 3/3042; H04B 2001/045; H04W 52/0206; H04W 52/343; H04W 52/367; H04W 52/52; Y02B 60/50
USPC ........... 455/424, 422.1, 420, 436, 438, 452.1, 455/446, 454, 439, 525, 67.11, 561
See application file for complete search history.

(56) References Cited

U.S. PATENT DOCUMENTS 6,223,056 B1 *  4/2001  Appel .......................... 455/561
6,272,366 B1    8/2001  Appel et al.
(Continued)

FOREIGN PATENT DOCUMENTS

| CN | 1859657 A | 11/2006 |
| CN | 101420790 A | 4/2009 |

(Continued)

OTHER PUBLICATIONS

International Search Report for PCT/EP2011/064355 dated Sep. 23, 2011.
(Continued)

*Primary Examiner* — Babar Sarwar
(74) *Attorney, Agent, or Firm* — Fay Sharpe LLP

(57) ABSTRACT

The invention relates to a method comprising the following steps:—measuring (S1) a traffic load;—determining (S2), if the traffic load is lower than a first threshold;—decreasing (S3) a maximum used output load of an amplifier of the base station, if the traffic load is lower than the first;—adjusting (S4) an operation point (102; 104; 106; 108; 112; 114; 116; 118; 124) of the amplifier, if the traffic load is lower than the first threshold;—determining (S2), if the traffic load is higher than a second threshold;—increasing (S5) the maximum used output load of the amplifier, if the traffic load is higher than the second threshold; and—adjusting (S4) the operation point of the amplifier, if the traffic load is higher than the second threshold.

14 Claims, 7 Drawing Sheets

(51) Int. Cl.
*H03F 3/24* (2006.01)
*H03G 3/30* (2006.01)
*H04W 52/34* (2009.01)
*H04W 52/36* (2009.01)
*H04W 52/52* (2009.01)
*H04B 1/04* (2006.01)

(52) U.S. Cl.
CPC ........ *H03F2200/451* (2013.01); *H03G 3/3042* (2013.01); *H04B 2001/045* (2013.01); *H04W 52/343* (2013.01); *H04W 52/367* (2013.01); *H04W 52/52* (2013.01); *Y02B 60/50* (2013.01)

(56) References Cited

U.S. PATENT DOCUMENTS

| | | | | |
|---|---|---|---|---|
| 6,327,462 | B1* | 12/2001 | Loke et al. | 455/127.2 |
| 2007/0024357 | A1* | 2/2007 | Plymale et al. | 330/51 |
| 2009/0203377 | A1* | 8/2009 | Kawasaki | 455/435.1 |

FOREIGN PATENT DOCUMENTS

| | | |
|---|---|---|
| CN | 101784065 A | 7/2010 |
| EP | 2 107 847 A1 | 10/2009 |
| GB | 2 332 997 A | 7/1999 |
| JP | 2000-216690 | 8/2000 |
| JP | 2004-500775 | 1/2004 |
| JP | 2007-037134 | 2/2007 |
| JP | 2008-301404 | 12/2008 |
| JP | 2010-130131 | 6/2010 |
| WO | 01/67621 A2 | 11/2001 |
| WO | 2008/050428 A1 | 5/2008 |

OTHER PUBLICATIONS

Notice of Reason for Refusal of corresponding Japanese Application No. 2013-532091, dated Aug. 14, 2014, 4 pages.

Notice of First Office Action of corresponding Chinese Application No. 201180043960.0, dated Feb. 2, 2015, 18 pages.

* cited by examiner

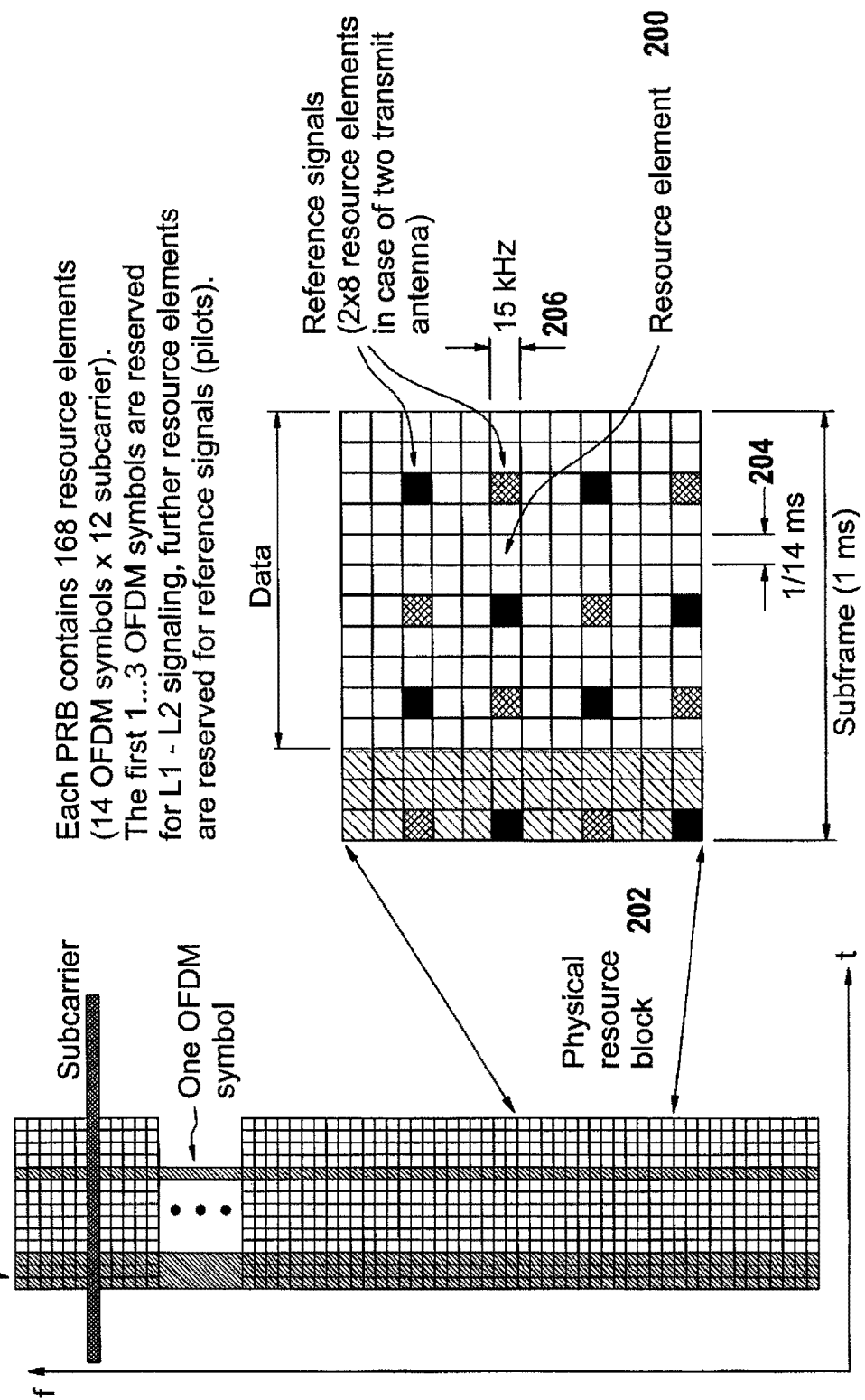

OPTIMIZING POWER CONSUMPTION OF A BASE STATION

FIELD OF THE INVENTION

The invention relates to the field of mobile telecommunication, more specifically to optimizing power consumption of a base station in a mobile telecommunication network.

BACKGROUND AND RELATED ART

A state of the art base station consumes a maximum power for a maximum traffic load in the respective cell. Such a base station is optimized for the maximum traffic load in the respective cell and consumes more than 50% of the maximum power even when no data is transmitted or received by the base station. The base station is operated inefficiently in times of low traffic loads in the respective cell, because a lower traffic load does not lead to a significantly lower power consumption of the base station. In other words, the ratio of consumed power per transmitted data bit increases significantly for relatively low traffic loads.

SUMMARY

It is an object of the invention to provide an improved method of communication in a mobile telecommunication network, an improved base station apparatus, and an improved computer-readable storage medium.

This object is achieved by the method, the base station apparatus, and the computer-readable storage medium according to the independent claims. Embodiments of the invention are given in the dependent claims.

The invention relates to a method of communicating in a cell of a mobile telecommunication network. A resource of the transmission medium is divided into a plurality of resource blocks. Each resource block is defined by a time period and a frequency interval within a time-frequency continuum. The resource blocks are used for scheduling data transmissions in said telecommunication network.

In other words, when data transmissions are scheduled on resource blocks the time and the frequency interval for the data transmissions is determined by the resource blocks.

An amplifier amplifies signals, which are transmitted by the base station. The load of the amplifier in a time period mainly depends on the number of resource blocks that are scheduled for this time period. It is to be noted that only a part of the resource blocks is used for scheduling data transmissions on them. Some resource blocks may be only used for transmitting pilots. The output load also comprises resource blocks, which are only used for transmitting pilots and not for transmitting data.

A traffic load is measured in the cell and subsequently it is determined, if the traffic load is lower than a first traffic load threshold. A maximum used output load of an amplifier of the base station is decreased, if the traffic load is lower than the first traffic load threshold. The maximum used output load of the amplifier is limited by the number of resource blocks, on which data transmissions are scheduled.

The maximum used output load of the amplifier may be decreased by scheduling data transmissions only on a subset of resource blocks and/or by decreasing a power level of user data at an input of the amplifier in some or all of the scheduled resource blocks.

If the traffic load is lower than the first traffic load threshold, an operation point of the amplifier of the base station of the cell is adjusted. The operation point of the amplifier is defined by the signal power level of the signals at the input of the amplifier and the signal output level at the output of the amplifier. Decreasing the maximum used output load of the amplifier results in decreasing the input voltage at the input of the power amplifier and decreasing the maximum output voltage at the output of the amplifier. In other words, the operation point of the amplifier would automatically be set to lower input and output signal levels. This means that the operation point is located further away from a saturation value for a relatively low maximum used output load than for a higher maximum used output load.

Adjusting the operation point may be described herein also as decreasing the saturation point of the amplifier. In other words, if the traffic load is lower than the first traffic load threshold, the saturation point of the power amplifier is decreased. Decreasing the saturation point may for example be performed by decreasing the bias voltage of the amplifier and/or by switching off a subset of amplifier components or stages, when the amplifier comprises a plurality of amplifier components or stages.

Hence, adjusting the operation point of the amplifier could also be referred to as adjusting the saturation value of the amplifier.

It is also determined, if the traffic load is higher than a second traffic load threshold. If so, the maximum used output load of the amplifier of the base station is increased and the operation point of the amplifier is consequently adjusted. Adjusting the operation point of the amplifier is performed correspondingly to the above described adjustment, when the traffic load is higher than the second traffic load threshold. Preferably, the operation point of the amplifier is set to a higher value by increasing the bias voltage and/or by switching on amplifier components or stages of the amplifier, when the traffic load is higher than the second traffic load threshold.

It is to be noted that the first and the second traffic load threshold may be changed dynamically. Thus, the thresholds do not need to be constant over the time. The first and the second traffic load threshold may also be the same value. Preferably, the second traffic load threshold is a higher value than the first traffic load threshold.

According to embodiments of the invention adjusting the operation point is performed by decreasing the bias voltage of the amplifier, if the traffic load is lower than the first traffic load threshold. Adjusting the operation point is performed by increasing the bias voltage of the amplifier, if the traffic load is higher than the second traffic load threshold.

According to embodiments of the invention the amplifier comprises a plurality of amplifier components or stages. Adjusting the operation point may be performed by switching off a subset of amplifier components or stages if the traffic load is lower than the first traffic load threshold. If the traffic load is higher than the second traffic load threshold, adjusting the operation point may be performed by switching on said amplifier components or stages.

According to embodiments of the invention decreasing the output load of the amplifier is performed by determining a first subset of resource blocks. All resource blocks of the first subset are also comprised by the plurality of resource blocks. In other words, the plurality of resource blocks is the maximum number of resource blocks and the subset of resource blocks may be less or equal to the maximum of the resource blocks. Data transmissions are scheduled only on the first subset of resource blocks, if the traffic load is lower than the first traffic load threshold. In other words, not every resource block is used for scheduling data transmissions. Only the first subset is used for scheduling data transmissions. It is to be noted that resource blocks may also be used for transmitting pilots. These resource blocks do not form part of the first subset.

The subset of resource blocks may be dynamically determined. This means that the number of resource blocks in the first subset may vary over time also when the traffic load does not vary. In other words, the subset of resource blocks may be changed, although the traffic load does not pass the first traffic load threshold. This allows the scheduler to select for each time period a subset of resource blocks with good transmission performance and to avoid using resource blocks with poor transmission performance.

Increasing the output load of the amplifier is performed by determining a second subset of resource blocks. All resource blocks of the second subset are also comprised by the plurality of resource blocks. The second subset comprises more resource blocks than the first subset. If the traffic load is higher than the second traffic load threshold, data transmissions are scheduled only on the second subset of resource blocks. In other words, when the traffic load exceeds the second traffic load threshold, more resource blocks are used for scheduling data transmissions than in the case when the traffic load is lower than the first traffic load threshold. The second subset of resource blocks may also vary in time, although the traffic load may always be higher than the second traffic load threshold.

According to embodiments of the invention decreasing the output load of the amplifier is performed by decreasing a power level of user data at an input of the amplifier in some or all of the scheduled resource blocks. A modulation encoding scheme being used for transmitting said resource blocks may be changed. In other words, when the power level of user data at the input of the amplifier is decreased a lower modulation encoding scheme is used for transmitting said resource blocks. A lower modulation encoding scheme means that data transmissions become more robust against interferences and noise. Hence, a lower modulation encoding scheme can compensate for the decreased power level. Increasing the output load of the amplifier is performed by increasing the power level of user data at the input of the amplifier in some or all of the scheduled resource blocks. In this case the modulation encoding scheme has also changed. Preferably a higher modulation encoding scheme is then used for transmitting said resource blocks. A higher modulation encoding scheme results in a higher data rate for the data transmission.

According to embodiments of the invention the method comprises a timer. The timer defines a time. The timer is started directly after having decreased or increased the output load of the amplifier. A further increasing or decreasing of the output load is disabled during the time defined by the timer. In other words, the timer avoids switching too fast between different output loads of the amplifier.

According to embodiments of the invention a time schedule is used for predetermining a development of the traffic load. The development of the traffic load is used for determining, if the maximum used output load of the amplifier and/or the operation point of the amplifier is adjusted. For example, on a Monday morning between 5 and 8 a.m. a traffic load above the second traffic load is expected and this sets an increasing of the maximum used output load of the amplifier. The time schedule can for example define times and/or days with higher and/or lower traffic loads. Hence, using the time schedule for predetermining the development of the traffic load means that the traffic load is determined for a future time period by using the time schedule.

The time schedule may be fixed or the time schedule may be changed dynamically. For dynamically changing the time schedule, results of measured traffic loads are stored in the base station. The time schedule is then generated or changed by using these results. For example the results show that on a Friday afternoon between 5 p.m. and 6 p.m. the traffic load always decreases by 20%. If the time schedule would predict a decreasing of only 10%, the time schedule is changed by using the measurement results.

According to embodiments of the invention the determination if the traffic load is lower than the first traffic load threshold or higher than the second traffic load threshold is triggered by the traffic load. In other words, when the traffic load passes by the first or the second traffic load threshold, the determination is triggered. Another approach could be to determine the traffic load regularly. The time intervals for the determination may be periodical or depending on the time schedule.

According to embodiments of the invention the method further comprises adjusting at least one signal processing part of the base station after decreasing or increasing the output load of the amplifier. The at least one signal processing part processes signals before the signals are transmitted by the base station. The signal processing part may for example be executing clipping algorithm in the digital signal conditioning part of the transceiver, processing hardware for baseband processing, and/or signal processing hardware in the digital signal processing circuit.

According to embodiments of the invention data is scheduled to be transmitted at a later point of time after measuring the traffic load, if the traffic load in the cell would be higher than the second traffic load threshold, when said data would be transmitted directly, and if the traffic load in the cell is lower than the second traffic load threshold when said data is transmitted at the later point of time. In other words, the scheduler reduces the traffic load by delaying data transmissions. This may be advantageous for avoiding increasing the maximum used output load of the amplifier.

According to embodiments of the invention the amplifier is switched off, when no data transmissions are scheduled. It is to be noted that in this case the data transmissions are to be understood as comprising user data and control data.

According to embodiments of the invention pilots, synchronization information, and/or a control channel are transmitted from the base station only for the currently used subset of resource blocks. For example if only the first subset of resource blocks is used, no pilots are transmitted for the rest of the resource blocks not belonging to the first subset of resource blocks.

According to embodiments of the invention the base station transmits a signal to a neighboring base station or a central network entity of the mobile telecommunication network. The neighboring base station is comprised by a neighboring cell. The signal is indicative of information about the subset of resource blocks currently being used by the base station. The neighboring base station or the central network entity uses this information for determining a further subset of resource blocks for scheduling data transmissions in the neighboring cell. In other words, by transmitting said signals the base stations of the mobile telecommunication network determine in a centralized or decentralized manner the use of which subsets of resource blocks in which cell is most advantageous. In the decentralized manner the central network entity manages exchanging of the signals and determining the subsets for each cell.

In another aspect the invention relates to a base station apparatus, wherein the base station apparatus is located in a cell of a mobile telecommunication network. The base station apparatus comprises an amplifier for amplifying signals and antenna means for transmitting the amplified signals and for receiving signals. The base station apparatus further comprises a processor, which is adapted for executing program instructions stored on a storage medium.

The processor is adapted for determining, if the traffic load is lower than a first traffic load threshold. Means for decreasing a maximum used output load of the amplifier of the base station may be implemented by the processor. It is to be noted that the means for decreasing the maximum used output load decrease the maximum used output load of the amplifier, if the traffic load is lower than the first traffic load threshold. The amplifier amplifies the signals being transmitted by the base station.

The base station apparatus further comprises means for adjusting an operation point of the amplifier of the base station, if the traffic load is lower than the first traffic load threshold. The base station further comprises means for determining, if the traffic load is higher than a second traffic load threshold and means for increasing the maximum used output load of the amplifier, if the traffic load is higher than the second traffic load threshold. Furthermore, the base station apparatus comprises means for adjusting the operation point of the amplifier, if the traffic load is higher than the second traffic load threshold.

In yet another aspect the invention relates to a computer-readable storage medium comprising instructions that when executed by a base station apparatus cause the base station apparatus to perform a method of communicating in a cell of a mobile telecommunication network. At least one resource is divided into a plurality of resource blocks. The resource blocks are used for scheduling data transmissions in said telecommunication network. The method comprises measuring a traffic load in the cell, determining, if the traffic load is lower than a first traffic load threshold, decreasing a maximum used output load of an amplifier of the base station, if the traffic load is lower than the first traffic load threshold. The amplifier amplifies signals being transmitted by the base station.

An operation point of the amplifier is adjusted, if the traffic load is lower than the first traffic load threshold. Further it is determined, if the traffic load is higher than a second traffic load threshold. The maximum used output load of the amplifier of the base station is increased, if the traffic load is higher than the second traffic load threshold. The operation point of the amplifier is adjusted, if the traffic load is higher than the second traffic load threshold.

BRIEF DESCRIPTION OF THE DRAWINGS

In the following embodiments of the invention are explained in greater detail, by way of example only, making reference to the drawings in which:

FIG. 2 is a schematic view of resource blocks.

DETAILED DESCRIPTION

Figure 1A:
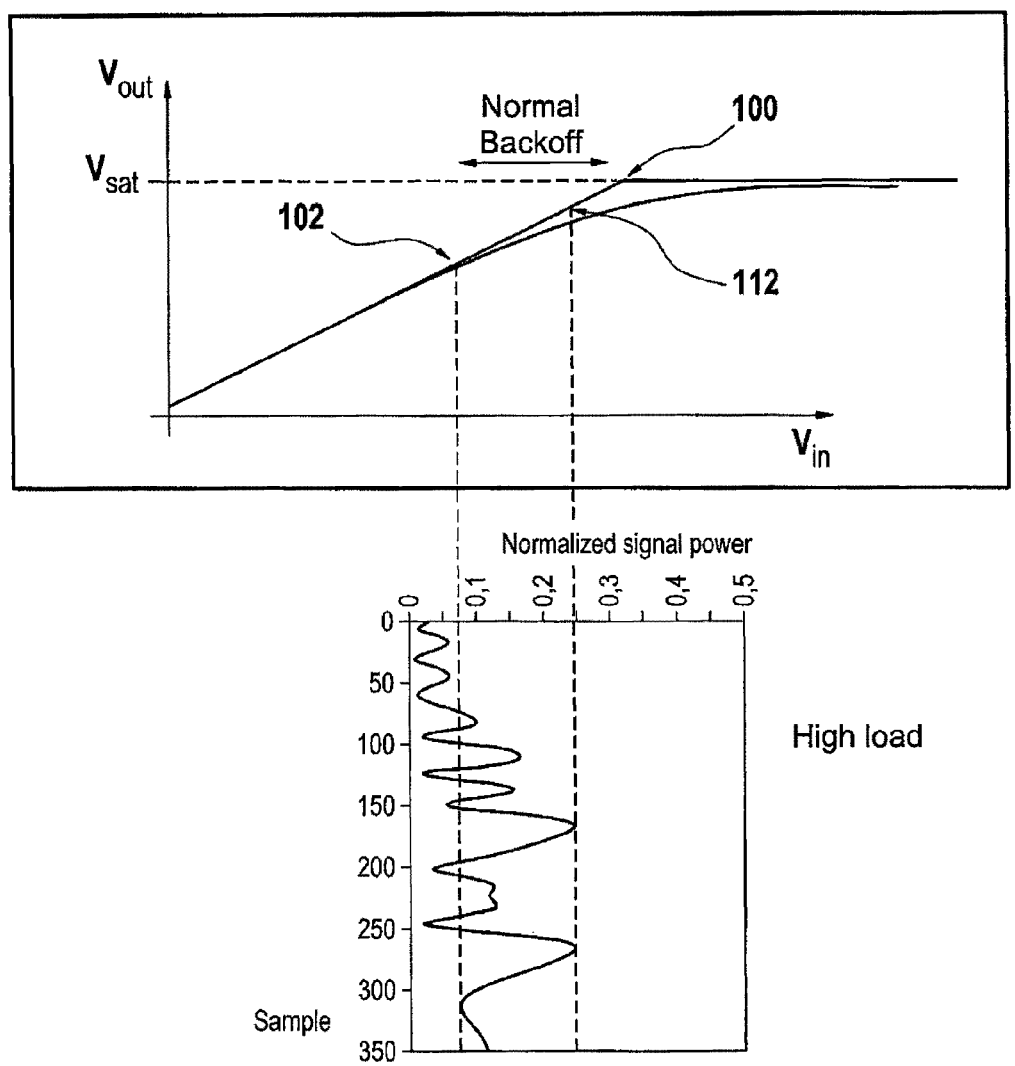
FIG. 1 is a schematic view of characteristic curves of a base station amplifier.
Figure 1B:
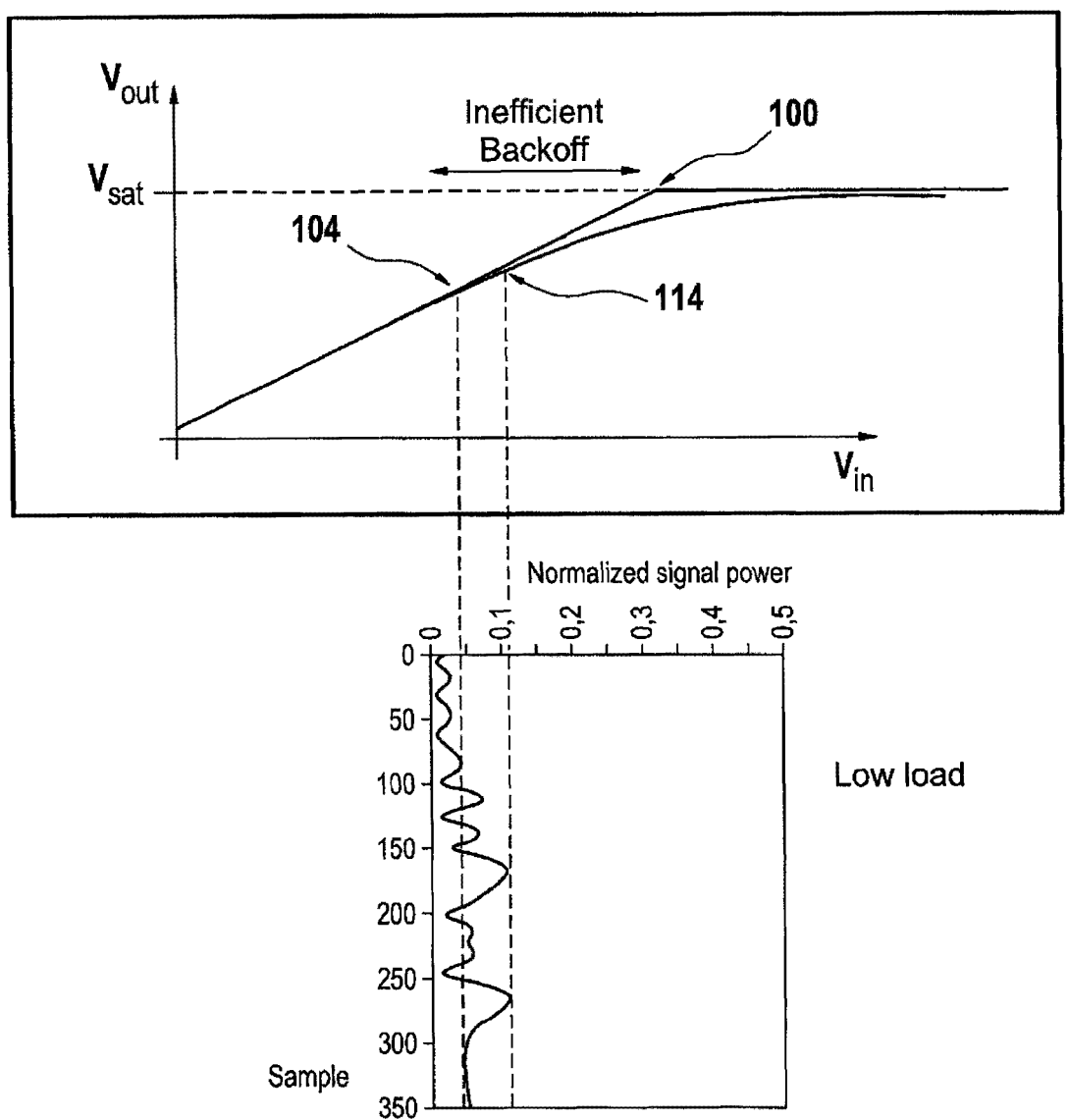

Like numbered elements in these Figs. are either identical elements or perform the same function. Elements which have been discussed previously will not necessarily be discussed in later Figs. if the function is identical.

FIG. 1 is a schematic view of characteristic curves of a base station amplifier. Each diagram consists of a characteristic curve and a corresponding traffic load diagram of the traffic load in the respective cell. FIG. 1a shows the characteristic curve for a state of the art amplifier in a cell with a relatively high traffic load. FIG. 1b illustrates the characteristic curve of the state of the art amplifier in a cell with a relatively low traffic load. The higher the traffic load the higher is the operation point of the amplifier. In other words, for higher traffic loads the operation point is located nearer to a saturation point 100 of the amplifier. FIG. 1a shows the characteristic curve of an amplifier and the operation point 102 in a cell with a relatively high traffic load. The maximum used operation point 112 of the amplifier lies for a high traffic load near the saturation value 100. For a relatively low traffic load depicted in FIG. 1b, the operation point 104 of the amplifier is located at a lower point of the characteristic curve, further away from the saturation point. This means that the amplifier consumes more power than necessary for sufficiently amplifying the signals.

Figure 1C:
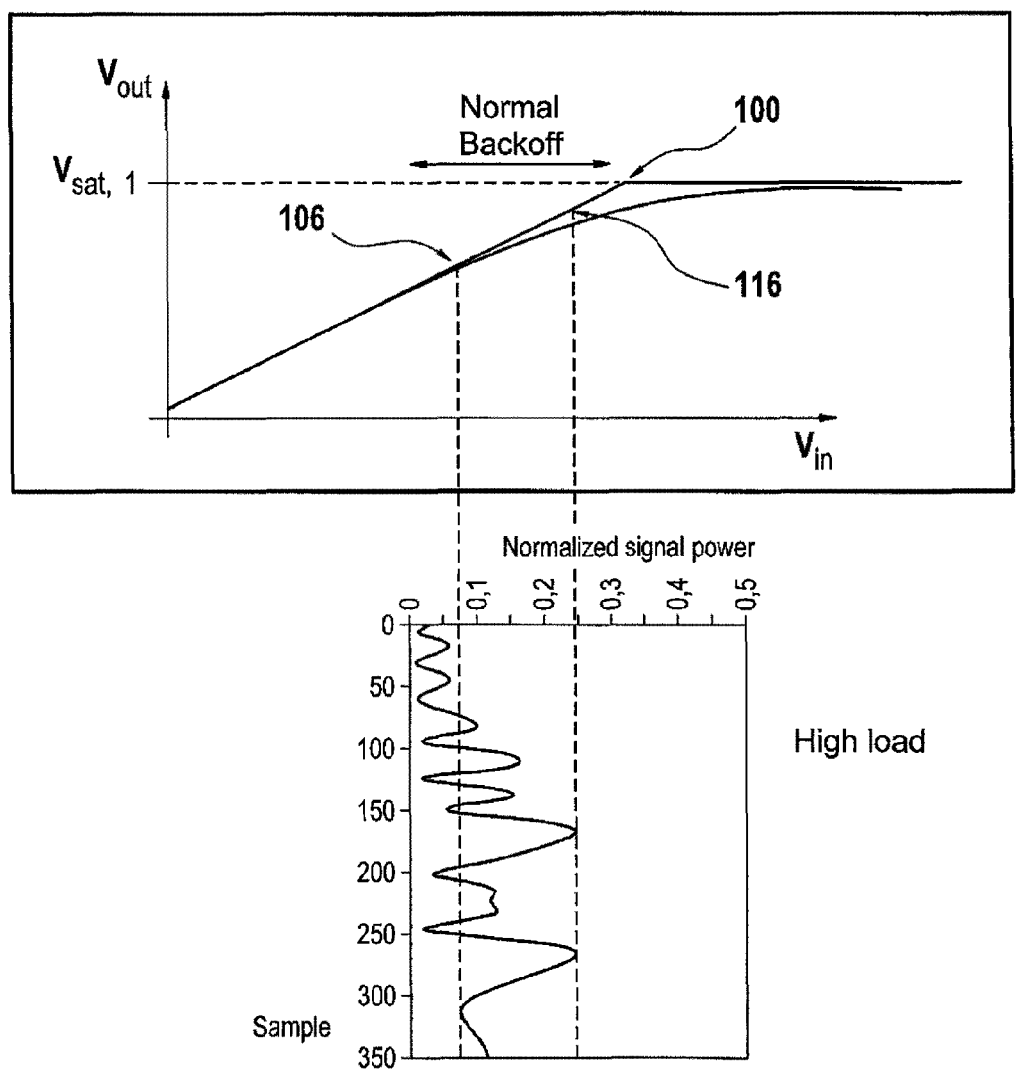
Figure 1D:
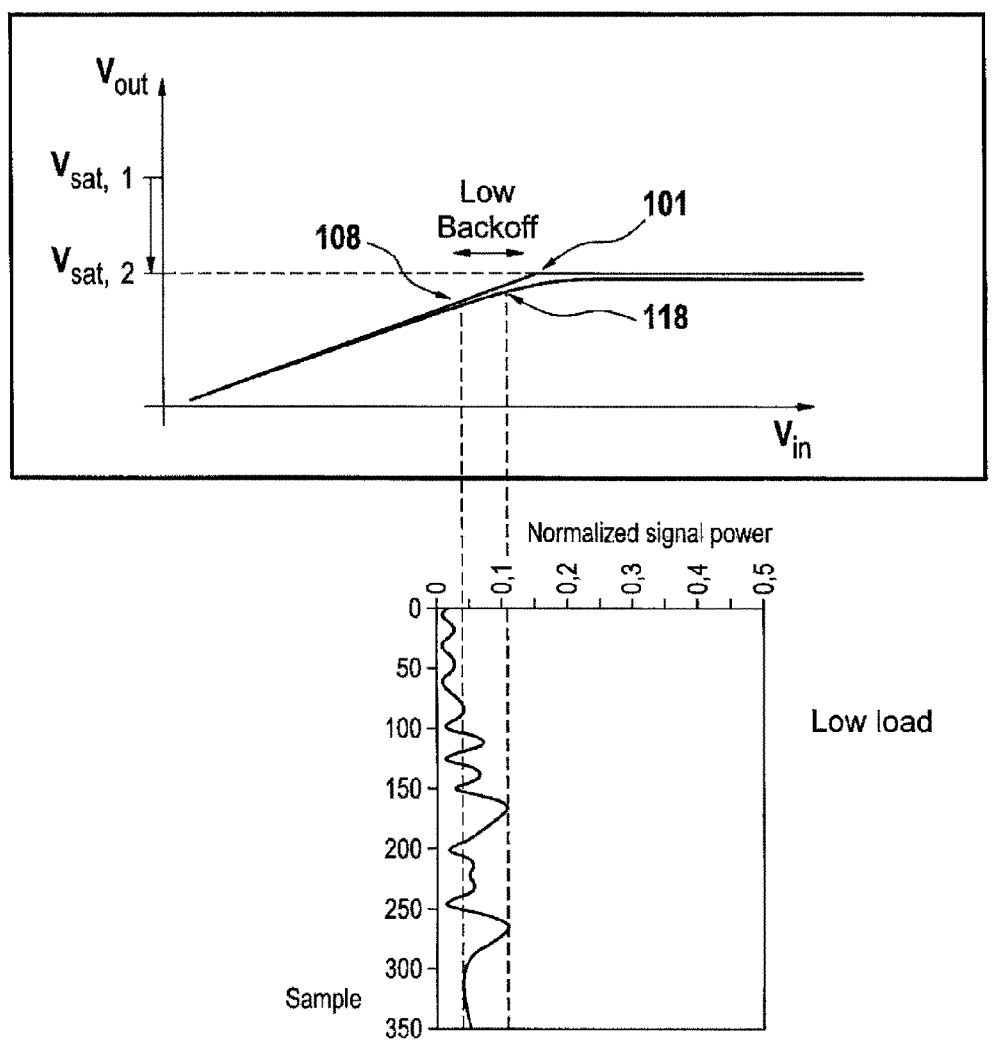

FIGS. 1c and 1d show the operation points 106 and 108 of the power amplifier operated with adjustment of the saturation power level according to embodiments of the invention. For a relatively high traffic load as depicted in FIG. 1c no difference can be seen to FIG. 1a. But in FIG. 1d the amplifier is operated with a lower saturation power level and the maximum used operation point 118 of the amplifier lies close to the adjusted saturation point 101 in case of a low traffic load. This means that the power consumption of the amplifier is reduced, because it is operated more efficiently than in FIG. 1c.

Adjusting the operation point may for example be performed by reducing the number of resource blocks used for scheduling data transmission and reducing the bias voltage of the amplifier. By reducing the number of resource blocks used for scheduling data transmissions, the maximum used output load of the amplifier is decreased. And by reducing the bias voltage of the amplifier, the saturation point of the amplifier is decreased, which results—as can be seen in FIG. 1d—in an approach of the saturation value 101 towards the operation point 108 and the maximum used operation point 118.

According to embodiments of the invention a maximum cell output power should be adapted to the traffic load allowing for a reconfiguration of the amplifier. The motivation is that the scheduler of a base station can be configured to utilize only a fraction of the resource elements so that it is assured that the power amplifier output is significantly lower than the maximum output. In this case the amplifier can be reconfigured such it operates much more efficiently. Such reconfiguration comprises e.g. the power supply of the power amplifier which can use lower bias voltage, so that less DC input power is consumed, and an adaptation of the clipping threshold in the digital signal conditioning part of the transceiver. Estimations show that for typical daily load profiles up to 30% power saving can be expected on daily average.

The scheduler predicts the required maximum capacity for the near future, e.g. from typical daily traffic patterns and/or from the traffic that was served in the latest seconds or minutes. Also the number of connected mobile devices such as mobile phones, PDAs, and/or mobile computers or the requested number of services by the connected mobile devices can be used for the estimation. Within the predicted capacity range the scheduler is still free to select the best resource elements from the full cell bandwidth. When at a later time the prediction for the near future changes, the operation point of the amplifier is adapted. The transition of the amplifier operation point can be smoothed out over several seconds to allow digital signal processing algorithms to adapt with minimum signal distortion.

Each resource element is still transmitted with the same spectral power density so the coverage area and link quality of the cell is not impacted. The method does not require modifications in the mobile device.

FIG. 2 is a schematic view of a plurality of resource blocks 202 in a downlink channel according to the 3GPP Long Term Evolution (LTE) standard. Each resource blocks comprise a plurality of resource elements 200. The resource elements are defined by a period of time 204 and a frequency interval 206. Consequently, a physical resource block is also defined by a larger period of time and a larger frequency interval. For example if a resource block 202 comprises 168 resource elements and each resource element is defined by a period of time 204 of 0.07 ms and a frequency interval 206 of 15 kHz, the resource block 200 is defined by a time of 1 ms and a frequency interval of 180 kHz.

Figure 3:
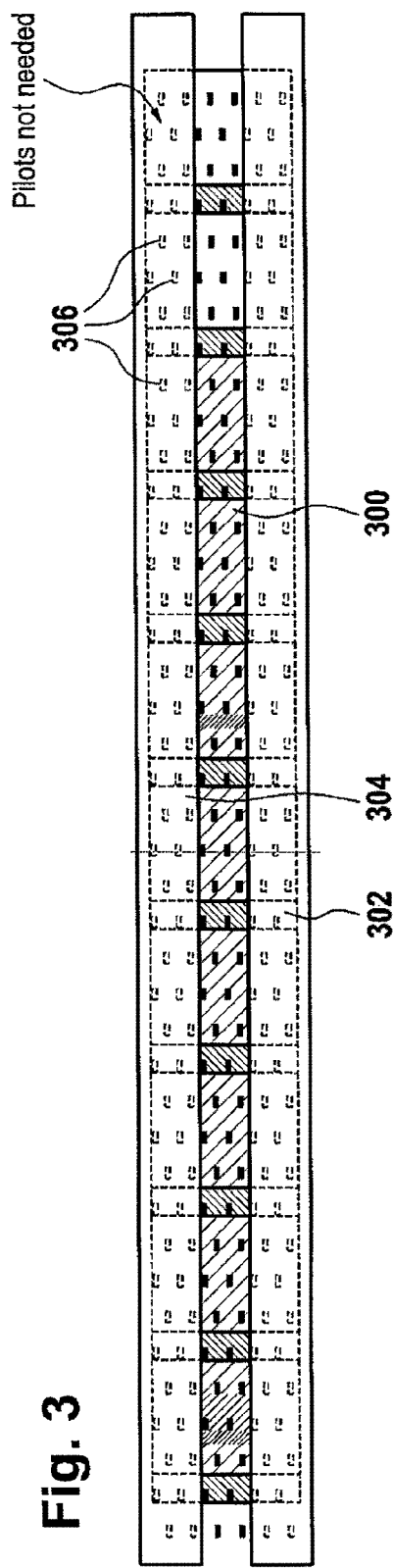
FIG. 3 is a schematic view of a subset of resource blocks being used for scheduling data transmissions over a time of 10 succeeding resource blocks.

FIG. 3 is a schematic view of a plurality of resource blocks 202. It is to be noted that only a subset 300 of resource blocks is used for scheduling data transmissions. Two other subsets 302 and 304 are not used for scheduling data transmission. In FIG. 3 only one third of the frequency interval is used. This results in the fact that the power amplifier can be operated with only one third of the maximum transmission power. Also pilots 306 of the subsets 302 and 304 not being used for scheduling data transmissions are suppressed. This may be optionally performed for saving more power.

Figure 4:
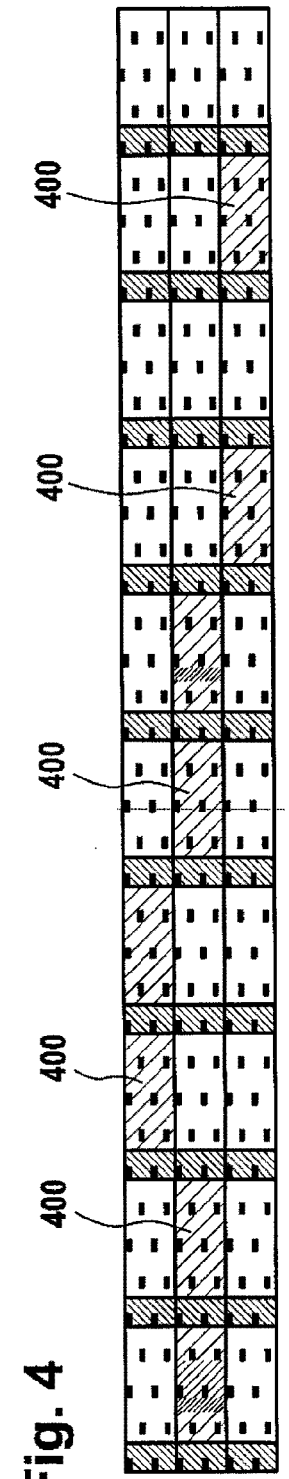
FIG. 4 is a schematic view of a subset of resource blocks with resource blocks varying over time.

FIG. 4 is a schematic view of a subset 400 of resource blocks, which varies over time. Over the whole time only one third of the resource blocks is used for scheduling. This means the subset 400 of resource blocks always comprises one third of the plurality of resource blocks, but not always the same frequency interval is used for scheduling data transmissions. This may be advantageous for opportunistic resource allocation, because the scheduler can still use the full scheduling diversity. In this case all pilots need to be sent. Interferences with neighboring cells may be reduced by this subset of resource blocks varying in time.

For example the base station may measure the average traffic load of the last 15 minutes and estimates the required capacity in the next 15 minutes. When e.g. 50% of the capacity is enough to serve the ongoing traffic, the scheduler limits the number of resource blocks that may be scheduled in one subframe to 50% of the maximum. This limits the maximum amplifier output and thus allows reducing the bias voltage and potentially also the peak to average power ratio (PAPR) of the power amplifier for the next 15 minutes. This will reduce the 3 dB compression point of the amplifier characteristic but due to the known limit of output power the bias voltage can be safely selected so that no saturation of output signal occurs. An example scenario for a macro cell is given in the following table, using typical output power for LTE macro cells with standardized bandwidth. These output powers apply also for a 20 MHz cell with limited scheduling within the full bandwidth, because the power amplifier performance does not significantly depend on the distribution of the scheduled resource blocks within the bandwidth.

| Bandwidth | Number of Resource Blocks per subframe | Relative capacity to 20 MHz bandwidth | Cell output power |
| --- | --- | --- | --- |
| 1.4 MHz | 6 | 6% | 37 dBm |
| 3 MHz | 15 | 15% | 40 dBm |
| 5 MHz | 25 | 25% | 43 dBm |
| 10 MHz | 50 | 50% | 46 dBm |
| 15 MHz | 75 | 75% | 48 dBm |
| 20 MHz | 100 | 100% | 49 dBm |

For example a cell operating at 20 MHz will require 49 dBm of radio frequency output power at full average load (e.g. in busy hours). During night times with only 5% of load the scheduler may be limited to a maximum of 6 resource blocks per subframe. In this case the maximum average output power is only 37 dBm and thus the saturation power level may be reduced by as much as 12 dB. The saturation power is mainly given by the DC power supply voltage of the power amplifier, which in turn drives a bias current. Lowering the saturation power level thus lowers the DC power consumption of the power amplifier. Additionally, for lower capacity utilization the PAPR may be lower so that the new saturation level can be chosen with lower backoff, i.e. closer to the average power level given in the above table. This enables even higher power savings than the table suggests.

Other embodiments may use other time scales for adaptation, in the range of seconds to hours.

Further embodiments may use additional power saving methods utilizing the limited capacity utilization of the scheduler. For example, lower data scheduling reduces the calculation effort of base band processing, so the base band processing hardware may be operated in a power save mode, e.g. by reducing the clock rate or switching off some parts of parallel processing circuits. Also other parts of the base station can benefit from the reduced resource utilization. A control interface can be used between the scheduler and those software and hardware components to trigger their switching of energy saving modes.

According to embodiments of the invention the base station uses a time schedule of the traffic behavior of the cells and configures accordingly the periods with defined capacity limitations of the scheduler. The following table shows an example of the capacity limit and the output power limit for working days and weekend in 5 steps each:

| Hour | Working day | Weekend |
| --- | --- | --- |
| 0 h-5 h | 15% and 40 dBm | 6% and 37 dBm |
| 5 h-8 h | 15% and 43 dBm | 15% and 40 dBm |
| 8 h-12 h | 50% and 46 dBm | 25% and 43 dBm |
| 12 h-18 h | 100% and 49 dBm | 50% and 46 dBm |
| 18 h-24 h | 50% and 46 dBm | 50% and 46 dBm |

There are 2 possibilities for the initiation of such a modification either by a centralized approach, where the Operating and Maintenance Network (O&M) signals the new configuration in terms of capacity limitations and output power towards the concerned cell as well as to their neighbor cells, or by a decentralized approach, where the base station is responsible for the new settings by using appropriate self-optimization algorithms. In the latter case the configured values will be exchanged over the 3GPP X2 interface to concerned neighbor cells, which need the information for the configuration of the AllowedMeasBandwidth, which is specified in 3GPP TS 36.331.

According to embodiments of the invention the adaptation of capacity is combined with switching off the power amplifier during fractions of a millisecond when actually no resource element is scheduled. In this case the scheduler could aggregate scheduled resource elements as much as possible within the capacity limitation to create as many time intervals as possible where no data or reference signals are to be transmitted.

According to embodiments of the invention the scheduler communicates the limitation of resource scheduling to one or several neighbouring cells. These cells can coordinate which elements are scheduled to reduce interference. For example in a situation with 50% load cell 1 could use all even resource blocks and cell 2 all odd blocks. Both cells save energy according to this invention. At the same time the interference between the cells is drastically reduced. The lower interference level can be leveraged to transmit at a higher modulation scheme, which further reduces the load level and yields more saving potential by further capacity limitation of the scheduler.

In yet another embodiment the scheduler triggers changes of the used capacity not only to the DC power supply of the power amplifier (to change the bias voltage) but also to the digital signal processing. This may allow reducing transient effects in the signal quality and speed up the adaptation of the digital signal processing. For example the thresholds of the clipping algorithm can be adapted synchronously to the upcoming change of power amplifier operation point. This requires implementation specific changes in the control interfaces of the base station hardware and might require modification of standardized equipment or interfaces.

Further pilots of subcarriers not belonging to the center band and thus not to the subcarriers foreseen to schedule data to mobile devices might be suppressed together with some adaptation of cell individual offsets used for mobility measurements by the mobile devices. As an alternative a special offset parameter could be introduced. This would allow saving pilot transmission power overhead for cases were cells are empty or nearly empty.

Figure 5:
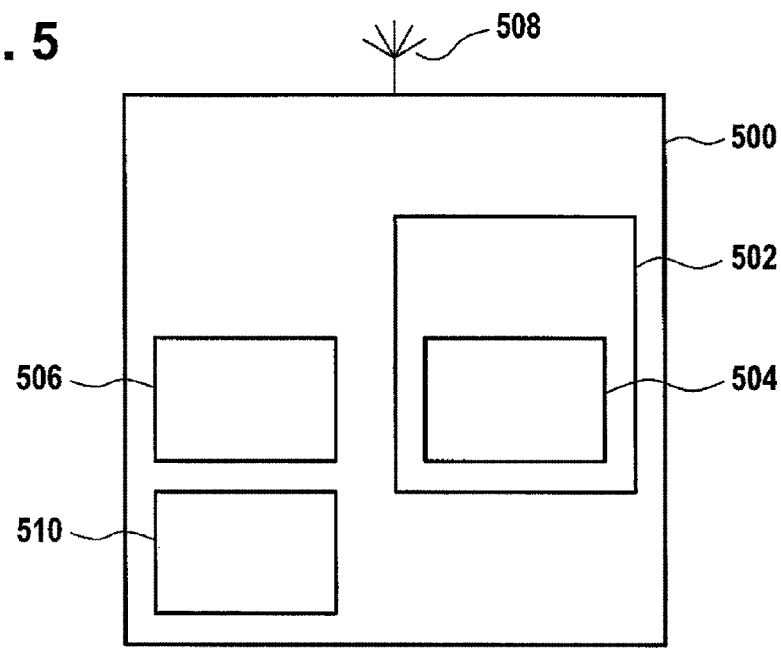
FIG. 5 is a block diagram of a base station apparatus according to embodiments of the invention.

FIG. 5 is a block diagram of a base station apparatus 500. The base station apparatus comprises a digital storage 502, an amplifier 506, an antenna 508, and a processor 510. Program instructions 504 are stored in digital storage 502.

In operation, the amplifier 506 amplifies signals, which are subsequently transmitted via antenna 508. The processor 510 is adapted for executing program instructions 504. The processor 510 is further adapted for scheduling data transmissions on resource blocks. The program instructions 504 executed by the processor 510 cause the base station apparatus 500 to measure or calculate a traffic load in the cell (not depicted) served by the base station apparatus 500.

The processor 510 is further adapted for determining, if the traffic load is lower than a first traffic load threshold or higher than a second traffic load threshold. A maximum used output load of the amplifier 506 is decreased, if the traffic load is lower than the first traffic load threshold. The maximum used output load of the amplifier 506 is increased, if the traffic load is higher than the second traffic load threshold. In both cases, the operation point of the amplifier 506 is subsequently adjusted for optimizing power consumption of the base station apparatus 500.

Figure 6:
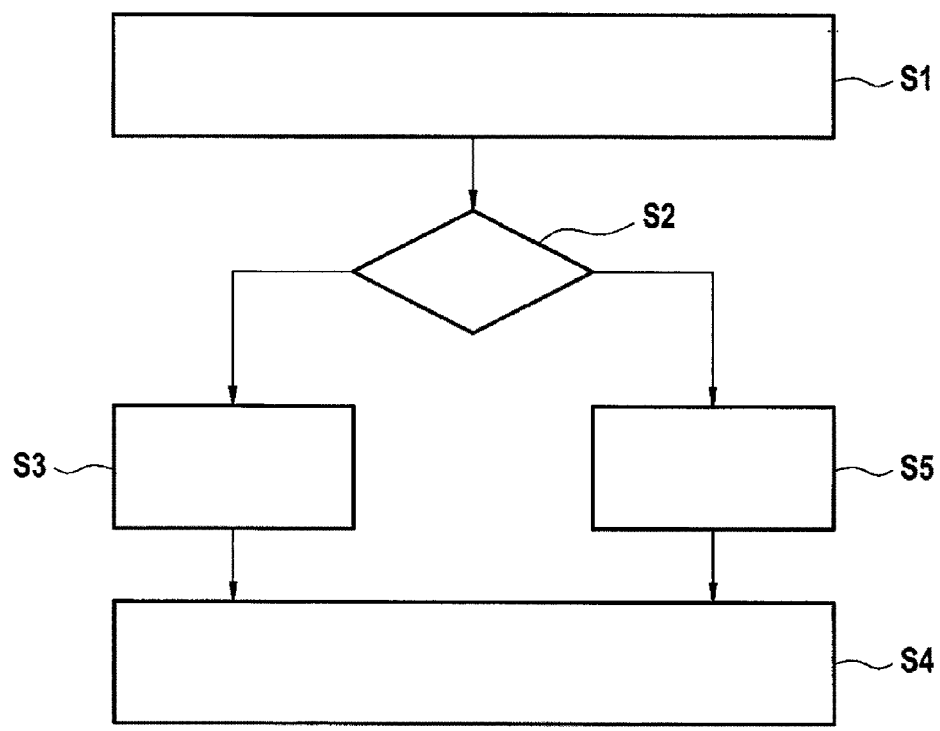
FIG. 6 is a flow diagram of a method according to embodiments of the invention.

FIG. 6 is a flow diagram of a method according to embodiments of the invention. In a first step S1 a traffic load in the cell is measured or calculated. Then, in step S2, it is determined if the traffic load is lower than a first traffic load threshold or higher than a second traffic load threshold.

If the traffic load is lower than the first traffic load threshold, the method proceeds to step S3 of FIG. 6. Step S3 comprises decreasing a maximum used output load of the amplifier of the base station. This may for example be performed by scheduling data transmissions only on a subset of resource blocks and/or by decreasing a power level of user data at an input of the amplifier in some or all of the scheduled resource blocks.

If the traffic load is higher than the second traffic load threshold, the method goes from step S2 to step S5. Step S5 comprises increasing the maximum used output load. This may be performed correspondingly to step S3 by scheduling data transmissions on more resource blocks and/or by increasing the power level of user data at the input of the amplifier. In other words, performing step S5 has the opposite effect of performing step S3.

In both cases, the operation point of the amplifier is adjusted in step S4. This may for example be performed by decreasing the bias voltage of the amplifier, if step S3 has been performed previously, or by increasing the bias voltage, if step S5 has been performed previously.

LIST OF REFERENCE NUMERALS 100 saturation value
102 operation point
104 operation point
106 operation point
108 operation point
112 maximum used operation point
114 maximum used operation point
116 maximum used operation point
118 maximum used operation point
200 resource element
202 resource blocks
204 time
206 frequency interval
300 subset of resource blocks
302 subset of resource blocks
304 subset of resource blocks
306 pilots
400 subset of resource blocks
500 base station
502 digital storage
504 program instructions
506 amplifier
508 antenna
510 processor

The invention claimed is:

1. A method of communicating in a cell of a mobile telecommunication network, wherein a resource is divided into a plurality of resource blocks, each resource block being defined by a time period and a frequency interval, wherein the resource blocks are used for scheduling data transmissions in said telecommunication network, wherein the method comprises:

measuring a traffic load in the cell;
determining, if the traffic load is lower than a first traffic load threshold;
decreasing a maximum used output load of an amplifier of the base station, if the traffic load is lower than the first traffic load threshold, wherein the amplifier amplifies signals being transmitted by the base station;
adjusting an operation point of the amplifier, if the traffic load is lower than the first traffic load threshold;
determining, if the traffic load is higher than a second traffic load threshold;

increasing the maximum used output load of the amplifier of the base station, if the traffic load is higher than the second traffic load threshold; and adjusting the operation point of the amplifier, if the traffic load is higher than the second traffic load threshold;

defining a time by a timer, wherein the timer is started directly after having decreased or increased the output load of the amplifier, and wherein a further increasing or decreasing of the output load is disabled during the time defined by the timer.

2. Method according to claim 1, wherein adjusting the operation point is performed by decreasing the bias voltage of the amplifier, if the traffic load is lower than the first traffic load threshold, and wherein adjusting the operation point is performed by increasing the bias voltage of the amplifier, if the traffic load is higher than the second traffic load threshold.

3. Method according to claim 1, wherein the amplifier comprises a plurality of amplifier components, wherein adjusting the operation point is performed by switching off a subset of amplifier components, if the traffic load is lower than the first traffic load threshold, and wherein adjusting the operation point is performed by switching on said amplifier components, if the traffic load is higher than the second traffic load threshold.

4. Method according to claim 1, wherein decreasing the output load of the amplifier is performed by determining a first subset of resource blocks, wherein all resource blocks of the first subset are also comprised by the plurality of resource blocks;

scheduling data transmissions only on the first subset of resource blocks, if the traffic load is lower than the first traffic load threshold;

and wherein increasing the output load of the amplifier is performed by determining a second subset of resource blocks, wherein all resource blocks of the second subset are also comprised by the plurality of resource blocks, and wherein the second subset comprises more resource blocks than the first subset;

scheduling data transmissions only on the second subset of resource blocks, if the traffic load is higher than the second traffic load threshold.

5. Method according to claim 1, wherein decreasing the output load of the amplifier is performed by decreasing a power level of user data at an input of the amplifier (506) in some or all of the scheduled resource blocks and changing a modulation and coding scheme being used for transmitting said resource blocks;

and wherein increasing the output load of the amplifier is performed by increasing the power level of user data at the input of the amplifier in some or all of the scheduled resource blocks and changing the modulation and coding scheme being used for transmitting said resource blocks.

6. Method according to claim 1, wherein a time schedule is used for predetermining a development of the traffic load, and wherein the development of the traffic load is used for determining if the maximum used output load of the amplifier and/or the operation point of the amplifier is adjusted.

7. Method according to claim 1, wherein the determination, if the traffic load is lower than the first traffic load threshold or higher than the second traffic load threshold, is triggered by the traffic load.

8. Method according to claim 1, wherein the method further comprises adjusting at least one signal processing part of the base station after decreasing or increasing the output load of the amplifier, wherein the at least one signal processing part processes signals before the signals are transmitted by the base station.

9. Method according to claim 1, wherein data is scheduled to be transmitted at a later point of time after measuring the traffic load, if the traffic load in the cell would be higher than the second traffic load threshold, when said data would be transmitted directly, and if the traffic load in the cell is lower than the second traffic load threshold, when said data is transmitted at the later point of time.

10. Method according to claim 1, wherein the amplifier is switched off, when no data transmissions are scheduled.

11. Method according to claim 1, wherein pilots, synchronization information, and/or a control channel are transmitted from the base station only for the currently used subset of resource blocks.

12. Method according to claim 1, wherein the base station transmits a signal to a neighbouring base station or a central network entity of the mobile telecommunication network, the neighbouring base station being comprised by a neighbouring cell, wherein the signal is indicative of information about the subset of resource blocks currently being used by the base station, and wherein the neighbouring base station or the central network entity uses this information for determining a further subset of resource blocks for scheduling data transmissions in the neighbouring cell.

13. A base station apparatus, the base station apparatus being located in a cell of a mobile telecommunication network, wherein the base station apparatus comprises:

an amplifier for amplifying signals;

an antenna for transmitting the amplified signals and for receiving signals;

a processor adapted to:

determine if the traffic load is lower than a first traffic load threshold;

decrease a maximum used output load of the amplifier of the base station, if the traffic load is lower than the first traffic load threshold;

adjust an operation point of the amplifier, if the traffic load is lower than the first traffic load threshold;

determine if the traffic load is higher than a second traffic load threshold;

increase the maximum used output load of the amplifier, if the traffic load is higher than the second traffic load threshold; and adjust the operation point of the amplifier, if the traffic load is higher than the second traffic load threshold; and a timer, the timer defining a time, wherein the timer is started directly after having decreased or increased the output load of the amplifier, and wherein a further increasing or decreasing of the output load is disabled during the time defined by the timer.

14. A non-transitory computer-readable storage medium comprising instructions that when executed by a base station apparatus cause the base station apparatus to perform a method of communicating in a cell of a mobile telecommunication network, wherein at least one resource is divided into a plurality of resource blocks, the resource blocks being used for scheduling data transmissions in said telecommunication network, wherein the method comprises:

measuring a traffic load in the cell;

determining, if the traffic load is lower than a first traffic load threshold;

decreasing a maximum used output load of an amplifier of the base station, if the traffic load is lower than the first traffic load threshold, wherein the amplifier amplifies signals being transmitted by the base station;

adjusting an operation point of the amplifier, if the traffic load is lower than the first traffic load threshold;

determining, if the traffic load is higher than a second traffic load threshold;

increasing the maximum used output load of the amplifier of the base station, if the traffic load is higher than the second traffic load threshold;

adjusting the operation point of the amplifier, if the traffic load is higher than the second traffic load threshold; and defining a time by a timer, wherein the timer is started directly after having decreased or increased the output load of the amplifier, and wherein a further increasing or decreasing of the output load is disabled during the time defined by the timer.

* * * * *